United States Patent [19]

Craven

[11] 4,249,258
[45] Feb. 3, 1981

[54] SELF-CALIBRATING VOLTAGE STANDING-WAVE RATIO METER SYSTEM

[75] Inventor: Tyson S. Craven, Cocoa, Fla.

[73] Assignee: Georgia Tech Research Institute, Atlanta, Ga.

[21] Appl. No.: 96,535

[22] Filed: Nov. 21, 1979

[51] Int. Cl.³ .......................................... H04B 17/00
[52] U.S. Cl. .................................. 455/115; 324/58 B
[58] Field of Search ......................... 455/115, 117, 67; 324/58 B, 140 D

[56] References Cited

U.S. PATENT DOCUMENTS

| | | | |
|---|---|---|---|
| 3,020,529 | 2/1962 | Turner | 455/117 |
| 3,842,358 | 10/1974 | Frazier | 455/115 |
| 3,870,957 | 3/1975 | Straw | 455/115 |
| 4,041,395 | 8/1977 | Hill | 455/115 |

*Primary Examiner*—Jin F. Ng
*Attorney, Agent, or Firm*—Newton, Hopkins & Ormsby

[57] ABSTRACT

A circuit for use in connection with a meter for measuring the voltage standing-wave ratio (VSWR) along a transmission line wherein forward and reflected voltages in the transmission line are coupled off and detected by two respective diodes. Calibration of the two diode detected forward and reverse voltages occurs in a series of resistor-diode combinations before they are fed onto the base and collector, respectively, of a transistor. A meter connected between the collector and emitter of the transistor measures the voltage drop across the transistor and this value is proportional to the voltage standing-wave ratio.

9 Claims, 1 Drawing Figure

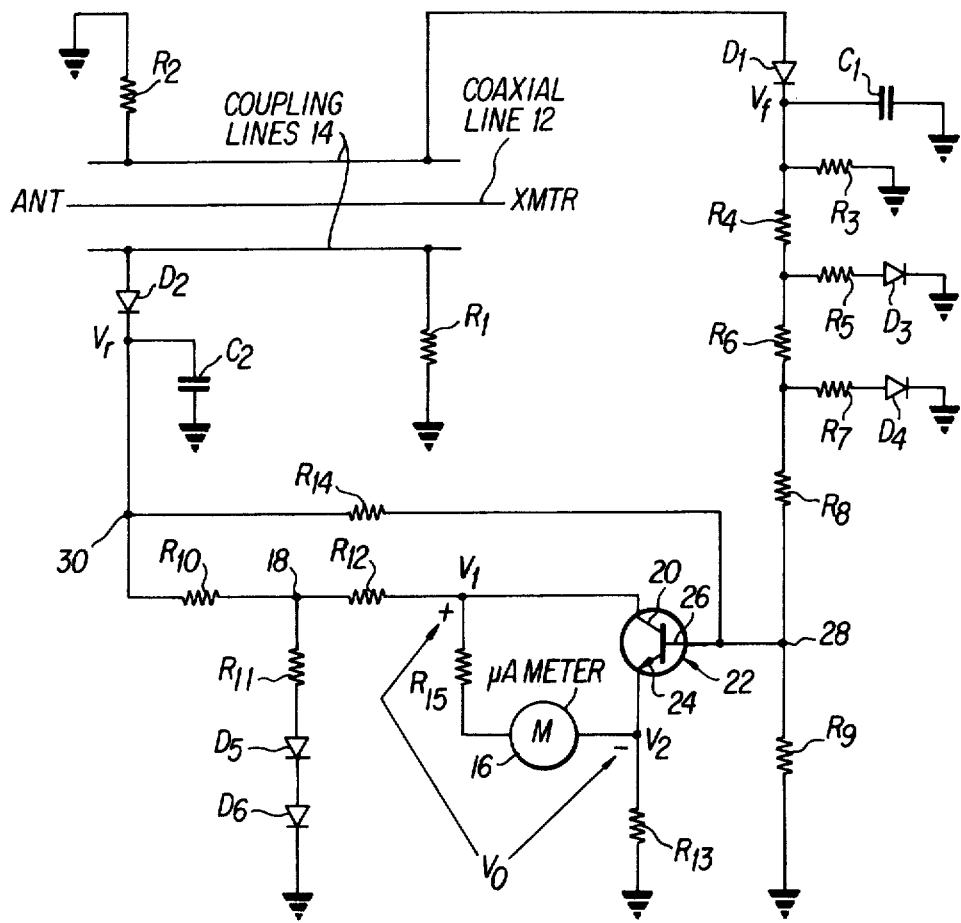

SELF-CALIBRATING VOLTAGE STANDING-WAVE RATIO METER SYSTEM

BACKGROUND OF THE INVENTION

1. Field of the Invention

This invention relates to the measurement of a voltage standing-wave ratio and, more particularly to a self-calibrating meter for measuring the voltage standing-wave ratio.

2. Description of the Prior Art

In conventional voltage standing-wave ratio (hereinafter referred to as VSWR) meters, the meter has to calibrated each time the VSWR is measured because the calibration is a function of the transmitted power and frequency. This requires switching the unit to the forward voltage position, turning on the transmitter and adjusting the potentiometer control knob until the meter reads full scale. Then, the switch is moved to the reflected voltage position, the transmitter is turned on again, and the VSWR is read on the meter.

One drawback of the conventional VSWR meter is that it has to be calibrated each time the VSWR is measured, which is time consuming, troublesome and more susceptible to human error in the final reading of the VSWR. In addition, these meters have a potentiometer which has to be turned up when low power is transmitted. This adjustment reduces the resistance applied to the output of the detector diodes because the output voltage of the diodes decreases when the resistance applied thereto decreases. This limits the sensitivity of the conventional meters when transmitting low power. Furthermore, these meters have a lower RC time constant on the output of the detector diodes which limits their sensitivity when making measurements at low frequencies.

In addition to the foregoing, there exists the possible danger, when using the conventional VSWR meters, of burning out the output stage of the transmitter. Since the transmitter must be turned on to calibrate these VSWR meters, if the VSWR is too high, the power reflected back to the transmitter could burn out the output stage of the transmitter. The operator of the meter has no way of knowing if the VSWR is too high because the VSWR cannot be measured with the VSWR meter until after the preliminary calibration procedure is completed.

There are known devices for measuring the VSWR in a transmission line directly with no necessity for calibration or switching. A typical example of such a system is set forth in U.S. Pat. No. 4,041,395 to J. C. Hill. In this patent, a device which incorporates a means for automatically measuring the standing-wave ratio is disclosed. A bidirectional coupler detects voltages which are proportional to the forward and reflected powers. Two operational amplifiers are utilized to calculate the sum and difference of these values. A meter coupled to the output of these amplifier circuits measures a voltage which is proportional to the logarithm of the sum over the difference of the forward and reflected values which is the standing wave ratio. No switching or calibration of the meter is required in the foregoing measuring operation.

Another example of a known technique for measuring the VSWR in a transmission line is disclosed in U.S. Pat. No. 3,842,358 to M. A. Frazier. The VSWR is calculated by processing the outputs of a directional coupler through a differential amplifier. The output of this amplifier, which is proportional to the VSWR, is utilized to control automatic circuitry in the system. A calibration step is not disclosed in this patent.

Although these metering devices do not require calibration or switching while measuring the VSWR, neither accomplishes this result with circuitry such as that of the subject invention described hereinafter in more detail.

SUMMARY OF THE INVENTION

The present invention is intended to eliminate the above-mentioned disadvantages of the prior art.

It is accordingly the principal object of this invention to provide novel metering apparatus which directly measures the voltage standing-wave ratio without the need to calibrate or switch the meter during a metering operation.

It is another object of this invention to provide a novel metering apparatus capable of being used with any frequency band.

It is yet another object of this invention to allow the metering apparatus to function over a wide range of transmitter power levels.

In accordance with the foregoing, the objects of this invention are accomplished through a metering device which measures VSWR without the need to calibrate or switch the meter. The device includes a bidirectional coupler which picks up voltages proportional to the forward and reflected voltage signals in the transmission line. The forward voltage, after being detected by a diode, is utilized to produce base current in a transistor. The reflected voltage, which has also been detected by a diode, is utilized to develop a voltage at the collector of the transistor. A meter connected between the collector and emitter of the transistor is utilized to measure the voltage drop across the transistor which is proportional to the VSWR. Various other resistors and diodes are incorporated for calibration and protection purposes. In operation, the meter directly indicates the VSWR, thereby eliminating the necessity for swtiching or calibration.

The circuit of this invention is similar to an AGC circuit used in a monopulse radar system for dividing the difference signal by the sum signal for pinpointing the location of the target that is being tracked on the radar. However, the function of this circuit, as seen in the Figure, is to divide the reverse voltage $(V_r)$ by the forward voltage $(V_f)$ to arrived at a properly calibrated voltage standing-wave ratio metered value.

BRIEF DESCRIPTION OF THE DRAWING

Various other objects, features and attendant advantages of the present invention will be more fully appreciated as the same becomes better understood from the following detailed description when considered in connection with the accompanying drawing wherein:

The FIGURE is a schematic illustration of a metering device and accompanying circuitry for measuring the voltage standing-wave ratio in a transmission line.

DETAILED DESCRIPTION OF THE PREFERRED EMBODIMENTS

The metering apparatus of this invention is housed in a container having dimensions of approximately 5"×3"×2 ½". Coaxial connectors are mounted on both ends of the container. In a meter of this type, other functions can be added to the meter (e.g., a switch can be added for a combination VSWR and RF power meter). The VSWR meter by itself, using the novel circuit design of this invention, will not require a switch. Only one panel meter is on the face for direct reading of the VSWR and RF power. Moreover, this VSWR meter does not have or require a calibration adjustment potentiometer, knob or switch as do other existing devices.

Referring to the circuit, the forward and reflected power in coaxial line 12 is coupled off and detected by diodes $D_1$ and $D_2$, respectively. The forward voltage $V_f$ appears at the output of diode $D_1$ and the reflected voltage $V_r$ appears at the output of diode $D_2$. Resistors $R_1$ and $R_2$ are matched to the coupling lines 14 and thereby prevent reflections. The other ends of resistors $R_1$ and $R_2$ are grounded. Capacitors $C_1$ and $C_2$ are RF bypass capacitors connected in parallel to the output or cathode side of diodes $D_1$ and $D_2$, respectively. The other ends of capacitors $C_1$ and $C_2$ are grounded.

The output voltage $V_O$, which is $V_1$ minus $V_2$, is proportional to $V_r$ divided by $V_f$. The VSWR is equal to:

$$\frac{1 + \frac{V_r}{V_f}}{1 - \frac{V_r}{V_f}}$$

This nonlinear relationship of VSWR with $V_r/V_f$ is read on the meter 16 of this invention using a nonlinear scale marked on the dial (not shown).

Resistors $R_4$, $R_6$, $R_8$ and $R_9$ are connected in series between the cathode of diode $D_1$ and ground. Grounded resistor $R_3$ is connected between capacitor $C_1$ and resistor $R_4$ and is in parallel with capacitor $C_1$. Resistor $R_5$ is in parallel with resistor $R_3$ and connected therebetween is resistor $R_4$. A forward-biased diode $D_3$ is connected between the other end of resistor $R_5$ and ground. Resistor $R_7$ is in parallel with resistor $R_5$ and diode $D_3$ and connected therebetween is resistor $R_6$. A forward-biased diode $D_4$ is connected between the other end of resistor $R_7$ and ground.

Resistors $R_{10}$, $R_{11}$ and forward-biased diodes $D_5$, $D_6$ are connected in series between the cathode of diode $D_2$ and ground.

Forward-biased diodes $D_3$, $D_4$, $D_5$ and $D_6$ are silicon diodes which bleed-off high current when transmitting high power and which allow the circuit to operate properly when transmitting over a wide range of high power levels. When transmitting low power, the coupled voltages, $V_r$ and $V_f$ are low and diodes $D_3$, $D_4$, $D_5$ and $D_6$ bleed-off a small amount of current thereby having minimal effect upon the rest of the circuit.

Resistor 12 has one end connected to node 18 between resistors $R_{10}$ and $R_{11}$ and the other end connected to the collector 20 of the NPN transistor 22. The emitter 24 of transistor 22 is connected to ground via resistor $R_{13}$. The base 26 of transistor 22 is connected to node 28 which lies between resistors $R_8$ and $R_9$. Resistor $R_{14}$ is connected between node 28 and node 30. Resistor $R_{15}$ is connected in series with meter 16 across the collector 20 and the emitter 24 of transistor 22.

The forward voltage, after detection by diode $D_1$, is calibrated by the series of associated resistors and diodes and produces a base current in the base 26 of transistor 22. The reflected voltage, after detection by diode $D_2$, is calibrated by the series of associated resistors and diodes and develops a voltage at the collector 20 of the transistor. The meter 16, connected between the collector 20 and the emitter 24 of the transistor 22, measures the voltage drop across the transistor which is proportional to the VSWR ($V_r/V_f$).

When the reflected power is a large percentage of the forward power, a high VSWR results and the ratio $V_r/V_f$ is high. When the reflected power is a small percentage of the forward power, there results a low VSWR and the ratio of $V_r/V_f$ is low. When $V_f$ increases, while keeping $V_r$ constant, more base current is supplied to the transistor 22, which increases the collector current and the meter 16 reads a lower VSWR. When $V_r$ increases, while keeping $V_f$ constant, $V_1$ increases which increases $V_O$ and the meter 16 reads a higher VSWR. The resistor $R_{14}$ is added to the circuit between the output of diode $D_2$ and the base 26 of transistor 22 to prevent $V_O$ from increasing too much with $V_r$. As $V_r$ increases, additional base current is supplied through resistor $R_{14}$ preventing $V_O$ from increasing too much as $V_r$ increases.

When high power is transmitted, the coupled voltage $V_f$ is large and diodes $D_3$ and $D_4$ begin to draw more current which reduces the base current on the transistor 22 and prevents saturation of the transistor to thereby allow correct VSWR readings when transmitting high power. As the VSWR gets higher when high power is transmitted, $V_r$ increases and diodes $D_5$ and $D_6$ bleed-off more current to thereby prevent $V_O$ from increasing too much.

The meter, and accompanying circuit of this invention, will correctly measure VSWR for transmitter power levels from 1 watt to 1,000 watts and over the frequency range of 1 MHz to 100 MHz. This is ideal for the CB and HF Ham bands. However, the circuit can be adapted for use over any other frequency band by placing it on the output of the coupling network normally used for that frequency band.

An abbreviated description of the operation of the circuit of this invention and the associated metering apparatus is as follows: (1) disconnect the antenna coax from the radio transmitter; (2) connect the antenna coax to the antenna connection on the VSWR meter; (3) connect a section (short length preferred to prevent signal loss) of coax from the transmitter to the transmitter connection on the VSWR meter; (4) turn on the transmitter (depress the microphone switch/button); and (5) read the VSWR directly from the meter. No calibration of the VSWR meter is required by the operator.

The foregoing demonstrates that this novel metering apparatus does not require calibration each time it is used to measure VSWR. Other presently marketed units require calibration each time the VSWR is measured. This unit will also extend the range over other units, especially at the lower end of the power and frequency ranges, because it presents a higher resistance to the output of the detector diodes. Since the output voltage of the diodes increases when the resistance applied thereto increases, this will increase the sensitivity of the meter when transmitting low power. The meter also has a high RC time constant on the output of the detector diode which increases its sensitivity when making measurements at low frequencies. Furthermore, the ever present danger that conventional meters have of burning out the output stage of the transmitter during preliminary calibration of the VSWR meter when there is a high VSWR which reflects a lot of power back to the transmitter is not present in this invention. Again, in the self-calibrating VSWR meter, no preliminary calibration is necessary because of the novel circuit used in conjunction therewith. The VSWR is read immediately when the transmitter is turned "on", and if the VSWR is too high, the operator thereof gets an immediate indication of the high VSWR and can immediately turn "off" the transmitter prior to incurring any damage to the output stage of the transmitter. In addition, this circuit has the added advantage of not requiring any batteries or an external power supply.

In the drawing, the diodes $D_3$, $D_4$, $D_5$ and $D_6$ can be replaced by zener diodes with the orientation reversed. The disclosed embodiment can be modified by adding a common-collector transistor stage on the output to act as a current amplifier to drive a different panel meter requiring more drive current. Another alternate embodiment can be created by adding a common-collector stage on the output of the detector diode $D_2$ to act as a high input impedance buffer to $V_r$. Moreover, it is possible to use FET's in the above-described embodiments.

Obviously, many modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A self-calibrating metering system for measuring the voltage standing-wave ratio of a transmission line, comprising:
    means for coupling off forward and reflecting voltage signals in said transmission line;
    means for detecting the forward voltage signal on said transmission line;
    means for detecting the reflected voltage signal on said transmission line;
    a transistor connected to both said means for detecting the forward voltage signal and said means for detecting the reflected voltage signal; said transistor having a base element connected to said means for detecting the forward voltage signal to produce a current signal in the base element and a collector element connected to said means for detecting the reflected voltage signal to develop a voltage signal at the collector; and said transistor having a grounded emitter element; and
    a metering device connected between the collector and the emitter of said transistor to measure the voltage across said transistor, with the measured value being proportional to the voltage standing-wave ratio value.

2. A self-calibrating metering system as in claim 1 wherein said means for detecting the forward voltage signal is a forward-biased diode and said means for detecting the reflected voltage signal is a forward-biased diode.

3. A self-calibrating metering system as in claim 2 further including a first grounded RF bypass capacitor connected between and in parallel with said forward-biased diode for detecting the forward voltage signal and the base element of said transistor, and a second grounded RF bypass capacitor connected between and in parallel with said forward-biased diode for detecting the reflecting voltage signal and the collector element of said transistor.

4. A self-calibrating metering system as in claim 2 further including a resistor connected between the ouput of said forward-biased diode for detecting the reflected voltage signal in said transmission line and the base element of said transistor to thereby prevent the voltage measured across said transistor by said metering device from increasing too rapidly with the detected reflected voltage signal.

5. A self-calibrating metering system as in claim 2 wherein an increase in the value of the forward voltage signal, while the reflected voltage signal is constant, produces a greater amount of base current in said transistor which increases the collector current and said metering device measures a lower voltage standing-wave ratio.

6. A self-calibrating metering system as in claim 2 wherein an increase in the value of the reflected voltage signal, while the forward voltage signal is constant, produces a greater voltage on the collector element of said transistor and said metering device measures a correspondingly higher voltage standing-wave ratio value.

7. A self-calibrating metering system as in claim 2 further including at lease one resistor-forward biased and grounded diode combination connected in parallel with said forward-biased diode for detecting the forward voltage signal and the base element of said transistor, and at least one resistor-forward biased and grounded diode combination connected in parallel with said forward-biased diode for detecting the reflecting voltage signal and the collector element of said transistor; said at least one resistor-diode combinations operating to bleed-off high current when high power transmission occurs through said transmission line to thereby allow the metering system to operate over an expanded range of power levels; and said at least one resistor-diode combinations bleeding-off little current when low power transmission occurs to thereby have minimal effect upon the remainder of the metering system.

8. A self-calibrating metering system as in claim 7 wherein the transmission power levels vary from 1 watt to 1,000 watts over the frequency range of 1 MHz to 100 MHz.

9. A self-calibrating metering system as in claim 7 wherein said at least one resistor-diode combination connected in parallel with said diode for detecting the forward voltage signal and the base element of said transistor reduces the base current on said transistor and prevents saturation thereof to thereby allow said metering device in the metering system to operate properly over a wide range of high power transmissions.

* * * * *